(12) United States Patent
Kato

(10) Patent No.: US 8,237,225 B2
(45) Date of Patent: Aug. 7, 2012

(54) SEMICONDUCTOR DEVICE FOR ELECTROSTATIC DISCHARGE PROTECTION

(75) Inventor: Shinjiro Kato, Chiba (JP)

(73) Assignee: Seiko Instruments Inc. (JP)

( * ) Notice: Subject to any disclaimer, the term of this patent is extended or adjusted under 35 U.S.C. 154(b) by 51 days.

(21) Appl. No.: 12/882,874

(22) Filed: Sep. 15, 2010

(65) Prior Publication Data

US 2011/0062522 A1    Mar. 17, 2011

(30) Foreign Application Priority Data

Sep. 17, 2009 (JP) .................... 2009-216245

(51) Int. Cl.
*H01L 23/62* (2006.01)

(52) U.S. Cl. ........ 257/355; 257/173; 257/546; 257/548; 257/E29.006

(58) Field of Classification Search ................... 257/107, 257/173, 174, 355, 360, 546, 548
See application file for complete search history.

(56) References Cited

U.S. PATENT DOCUMENTS

2005/0082618 A1* 4/2005 Wu et al. .................... 257/355
2006/0151836 A1* 7/2006 Salcedo et al. .............. 257/362

FOREIGN PATENT DOCUMENTS

JP    2005-072607 A    3/2005

* cited by examiner

*Primary Examiner* — Jerome Jackson, Jr.
*Assistant Examiner* — Jose R Diaz
(74) *Attorney, Agent, or Firm* — Brinks Hofer Gilson & Lione

(57) ABSTRACT

Provided is a semiconductor device for electrostatic discharge protection capable of protecting an inner circuit from both noises of an overcurrent noise of an ESD and an overcurrent noise of a latch-up test while achieving size reduction, by sharing a guard ring formed in a periphery of an ESD protection element with a cathode of a latch-up protection diode for protecting the inner circuit from the overcurrent noise of the latch-up test.

5 Claims, 4 Drawing Sheets

SEMICONDUCTOR DEVICE FOR ELECTROSTATIC DISCHARGE PROTECTION

RELATED APPLICATIONS

This application claims priority under 35 U.S.C. §119 to Japanese Patent Application No. 2009-216245 filed on Sep. 17, 2009, the entire content of which is hereby incorporated by reference.

BACKGROUND OF THE INVENTION

1. Field of the Invention

The present invention relates to a semiconductor device for electrostatic discharge protection of a high withstanding voltage semiconductor integrated circuit.

2. Description of the Related Art

In a semiconductor integrated circuit, an electrostatic discharge protection circuit is generally formed between an outer terminal and an inner circuit so as to prevent breakage of the inner circuit due to an overcurrent noise (for example, electrostatic discharge (ESD)) applied from the outer terminal or an overcurrent pulse which may be assumed by a latch-up test. For example, assuming a case where the overcurrent noise is applied to an I/O terminal, the electrostatic discharge protection circuit described above is designed to operate when the voltage applied to the I/O terminal becomes a voltage higher by a few volts than a maximum operating voltage of the semiconductor integrated circuit (hereinafter, referred to as trigger voltage), and to allow the overcurrent noise to flow into a ground terminal or a power supply terminal. The simplest method to achieve this object is to connect an element serving as an electrostatic discharge protection element between the I/O terminal and the ground terminal, the element having a characteristic which does not allow a current to flow until a certain voltage is applied but allows the current to rapidly flow after a voltage equal to or more than the certain voltage is applied, such as a diode (reverse connection), a metal oxide semiconductor (MOS) transistor having a gate in an off state, or a thyristor. A tolerance against the overcurrent noise of the semiconductor integrated circuit including such electrostatic discharge protection element described above may be evaluated using a simulator such as an ESD simulator or a latch-up simulator.

In a case where a semiconductor integrated circuit having a higher withstanding voltage is manufactured, the electrostatic discharge protection element used for protection is required to allow the overcurrent noise to flow into the ground terminal or the power supply terminal at a higher trigger voltage. Accordingly, the electrostatic discharge protection element is required to be an element stronger against breakage due to Joule heat. In addition, concerning a pulse width of the overcurrent noise, condition with respect to the breakage due to the Joule heat becomes more severe as the pulse width becomes longer in time. In particular, the pulse width of the overcurrent noise used in the latch-up test is of the order of few ms, which is longer in time compared with other noises. Accordingly, it is particularly necessary to pay attention to breakage of the electrostatic discharge protection element itself.

In order to prevent breakage of the electrostatic discharge protection element itself due to the Joule heat, decrease of current density per unit area of a section in which a current is applied is required to suppress heat generation. However, this increases the element in size, and the size may not be unlimitedly increased in view of cost. Further, the method for protection may differ according to a state of each terminal when the overcurrent noise is applied. For example, in a case of the ESD, the noise is applied under a state in which terminals other than the terminal to which the noise is applied and the ground terminal are in an open state, and hence the ground terminal is the only terminal for releasing the noise. However, in a case of the overcurrent noise of the latch-up test, the overcurrent noise is applied to the remaining terminals under a state in which the power supply terminal and the ground terminal are in an electricity state, and hence terminals for releasing the overcurrent noise may be two, that is, the power supply terminal and the ground terminal.

Protection circuits such as circuits described in a first conventional example (FIG. 4) and a second conventional example (FIG. 5) have been conceived as a method capable of protecting the inner circuit from the overcurrent noise having a pulse width of the order of few ms, such as the overcurrent noise of the ESD and the test pulse of the latch-up simulator, in a case where the inner circuit having a higher withstanding voltage is protected as described above, without increasing the chip size (for example, see Japanese Patent Application Laid-open No. 2005-72607).

The first conventional example (FIG. 4) describes a protection circuit including a protection diode 5 connected between an I/O terminal 2 and a ground terminal 3, for protection against the overcurrent noise of the ESD, and a protection diode 4 connected between a power supply terminal 1 and the I/O terminal 2, for protection against the overcurrent noise of the latch-up test. For example, when the overcurrent noise of the ESD is applied to the I/O terminal 2, because the power supply terminal 1 is not connected, breakdown of the protection diode 5 connected between the I/O terminal 2 and the ground terminal 3 occurs, and hence the overcurrent noise may be released to the ground terminal 3. In the case of the latch-up test, the power supply terminal 1 is connected to a power source and a potential is maintained to the maximum operating voltage. For example, when the overcurrent noise is applied to the I/O terminal 2 in this state, the overcurrent noise flows through the protection diode 4 connected between the I/O terminal 2 and the power supply terminal 1 when the potential of the I/O terminal 2 becomes equal to or more than (potential of the power supply terminal 1+diffusion potential of the protection diode 4), and then flows into the power supply terminal 1 in a forward direction.

The second conventional example (FIG. 5) describes a protection circuit including an off MOS type field effect transistor 10 connected between an I/O terminal 7 and a ground terminal 8, for protection against the overcurrent noise of the ESD, and a protection diode 9 connected between a power supply terminal 6 and the I/O terminal 7, for protection against the overcurrent noise of the latch-up test. For example, when the overcurrent noise of the ESD is applied to the I/O terminal 7, because the power supply terminal 6 is not connected, breakdown of the MOS type field effect transistor 10 having a gate in an off state and connected between the I/O terminal 7 and the ground terminal 8 occurs, and hence the overcurrent noise may be released to the ground terminal 8. In the case of the latch-up test, the power supply terminal 6 is connected to the power source and the potential is maintained to the maximum operating voltage. For example, when the overcurrent noise is applied to the I/O terminal 7 in this state, the overcurrent noise flows through the protection diode 9 connected between the I/O terminal 7 and the power supply terminal 6 when the potential of the I/O terminal 7 becomes equal to or more than (potential of the power supply terminal 6+diffusion potential of the protection diode 9), and then flows into the power supply terminal 6 in a forward direction.

It is necessary to take into consideration that, in a case where the electrostatic discharge protection circuits as described in the conventional examples are actually manufactured, when the overcurrent noise is applied to the electrostatic discharge protection element, electrons and holes are generated due to the overcurrent noise, and thus there is a possibility to turn on a parasitic bipolar transistor formed between internal elements. As a method of absorbing the electrons and the holes generated due to the overcurrent noise and suppressing diffusion thereof into the inner circuit to prevent turning on the parasitic bipolar transistor formed between the internal elements, it is conceivable to surround the periphery of the protection element by two rings, that is, for example, a diffusion region (hereinafter, referred to as guard ring) having an opposite conductivity type to that of the substrate, which is connected to the power supply terminal and has a fixed potential, and a guard ring having the same conductivity type as the substrate, which is connected to the ground terminal and has a fixed potential.

When the electrostatic discharge protection circuits as described in the conventional examples are actually manufactured, a configuration thereof is as illustrated in FIG. 6. A protection element 100 has the following configuration. For example, in a p-type semiconductor substrate, for example, an n-channel type MOS transistor 19 having a gate in an off state is formed as an ESD protection element for protection against the overcurrent noise of the ESD. A drain of the re-channel type MOS transistor 19 is connected to the power supply terminal and each of a source, a gate, and a backgate thereof is connected to the ground terminal. In the periphery of the n-channel type MOS transistor 19, for example, a p-type well 13 serving as a guard ring having the same conductivity type as the substrate is formed, and further, for example, a p-type high concentration region 14 for contacting to the ground terminal is formed. Further, on an outer side thereof, for example, an n-type well 11 as a guard ring having an opposite conductivity type to that of the substrate is formed, and further, for example, an n-type high concentration region 12 for contacting to the ground terminal is formed. In addition, an electrostatic discharge protection circuit device 101 has the following configuration. As a latch-up protection diode for protection against the overcurrent noise of the latch-up test, a latch-up protection diode 18 having, for example, an anode corresponding to a p-type high concentration region 17 and, for example, a cathode corresponding to an n-type well 15 and an n-type high concentration region 16 is formed. The anode is connected to the I/O terminal, and the cathode is connected to the power supply terminal. In the periphery of the latch-up protection diode 18, for example, the p-type well 13 serving as a guard ring having the same conductivity type is formed, and further, for example, the p-type high concentration region 14 for contacting to the ground terminal is formed. Further, on the outer side thereof, for example, the n-type well 11 as a guard ring having the opposite conductivity type to that of the substrate is formed, and further, for example, the n-type high concentration region 12 for contacting to the ground terminal is formed.

When the electrostatic discharge protection circuits as described in the conventional examples are manufactured, there require two protection elements, that is, the n-channel MOS type field effect transistor 19 having a gate in an off state for protection against the overcurrent noise of the ESD and the latch-up protection diode 18 for protection against the overcurrent noise of the latch-up test. Each of the elements is required to be surrounded by the p-type well (guard ring) 13 having the same conductivity type as the substrate and the n-type well (guard ring) 11 having the opposite conductivity type to that of the substrate, leading to a problem in that the chip is increased in size.

SUMMARY OF THE INVENTION

In order to solve the above-mentioned problem, a semiconductor device for electrostatic discharge protection according to the present invention includes a protection circuit including: an ESD protection element connected between an I/O terminal and a ground terminal; and a diode having a cathode corresponding to a guard ring of the ESD protection element, which is connected to a power supply terminal, and an anode which is connected to the I/O terminal, the diode serving as a latch-up protection diode for protection against an overcurrent noise of a latch-up test. Further, in a case where many carriers flow from the anode into a substrate by passing through the cathode, a parasitic bipolar transistor in an inner circuit may be turned on by the carriers. Accordingly an embedded diffusion region having the same polarity as the guard ring is additionally formed in the guard ring of the ESD protection element to restrain carriers flowing into the substrate, and to prevent the parasitic bipolar transistor from turning on, permitting protection of the inner circuit from both noises of the overcurrent noise of the ESD and the overcurrent noise of the latch-up test.

By sharing the guard ring of the ESD protection element with the cathode of the latch-up protection diode for protection against the overcurrent noise of the latch-up test, the inner circuit may be protected from both noises of the overcurrent noise of the ESD and the overcurrent noise of the latch-up test, and further, the protection element may be reduced in size.

DETAILED DESCRIPTION OF THE PREFERRED EMBODIMENTS

Hereinafter, preferred embodiments for carrying out the present invention are described with reference to the attached drawings. Note that, in the following description, terms of "I/O terminal" and "input/output terminal" include not only a so-called input/output terminal, but also a terminal for only input and a terminal for only output.

First Embodiment

Figure 1:
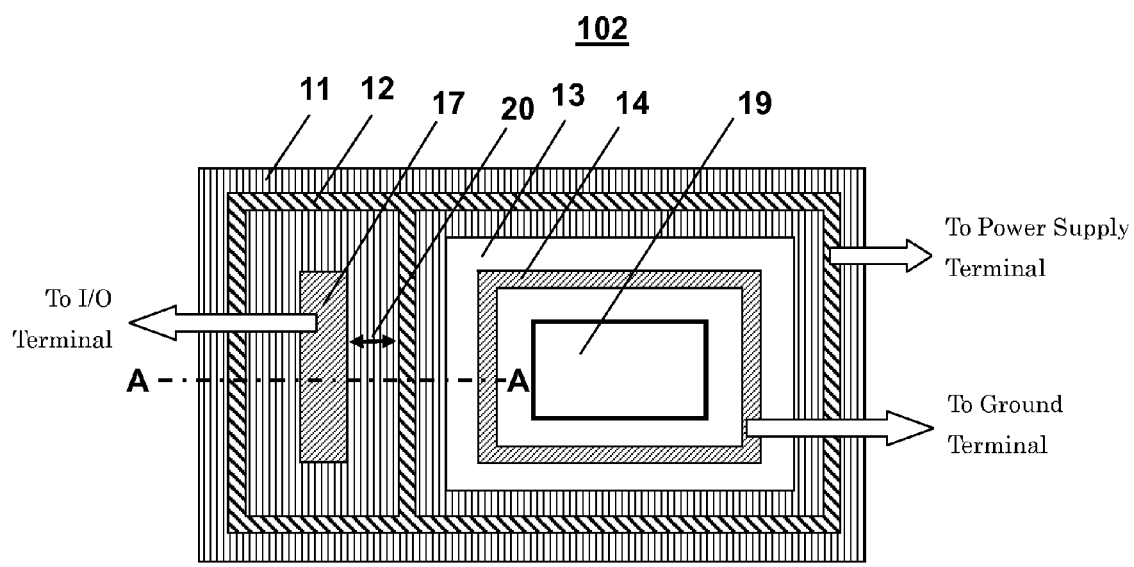
FIG. 1 is a plan view of a semiconductor device for electrostatic discharge protection according to a first embodiment of the present invention.

FIG. 1 is a plan view of a semiconductor device for electrostatic discharge protection 102 according to a first embodiment of the present invention.

The semiconductor device for electrostatic discharge protection 102 has the following configuration. For example, in a surface of a p-type silicon substrate having a resistance of 20 to 30 Ωcm, for example, an n-channel metal oxide semiconductor (MOS) type field effect transistor 19 having a gate in an off state is formed as an electrostatic discharge (ESD) protection element for protection against an overcurrent noise of an ESD. In the periphery of the n-channel MOS type field effect transistor 19, for example, a p-type well region 13 is formed, containing boron as an impurity and having a concentration of about $1\times10^{16}$ cm$^{-3}$ and, for example, a depth of 10 μm to 15 μm, as a first conductivity type guard ring. In the p-type well region 13, for example, a p-type high concentration diffusion region 14 for contacting to a ground terminal, containing boron as an impurity and having a concentration of about $1\times10^{20}$ cm$^{-3}$, is formed.

Next, in the periphery of the p-type well region 13, for example, an n-type well region 11 is formed, containing phosphorus as an impurity and having a concentration of about $1\times10^{16}$ cm$^{-3}$ and, for example, a depth of 10 μm to 15 μm, as a second conductivity type guard ring. In a part of the n-type well region 11, for example, a p-type high concentration region 17 is formed, containing boron as an impurity and having a concentration of about $1\times10^{20}$ cm$^{-3}$, as an anode of a protection diode for protection against an overcurrent noise of a latch-up test. The n-type well region 11 serves both as a cathode of the protection diode and the second conductivity type guard ring.

Figure 5:
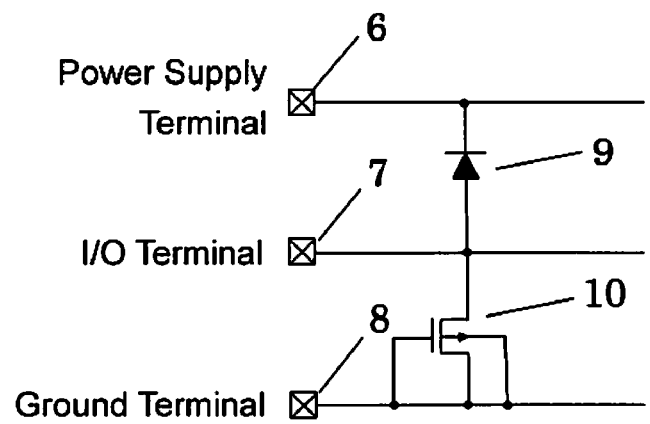
FIG. 5 is a protection circuit diagram according to a second conventional example.
Figure 6:
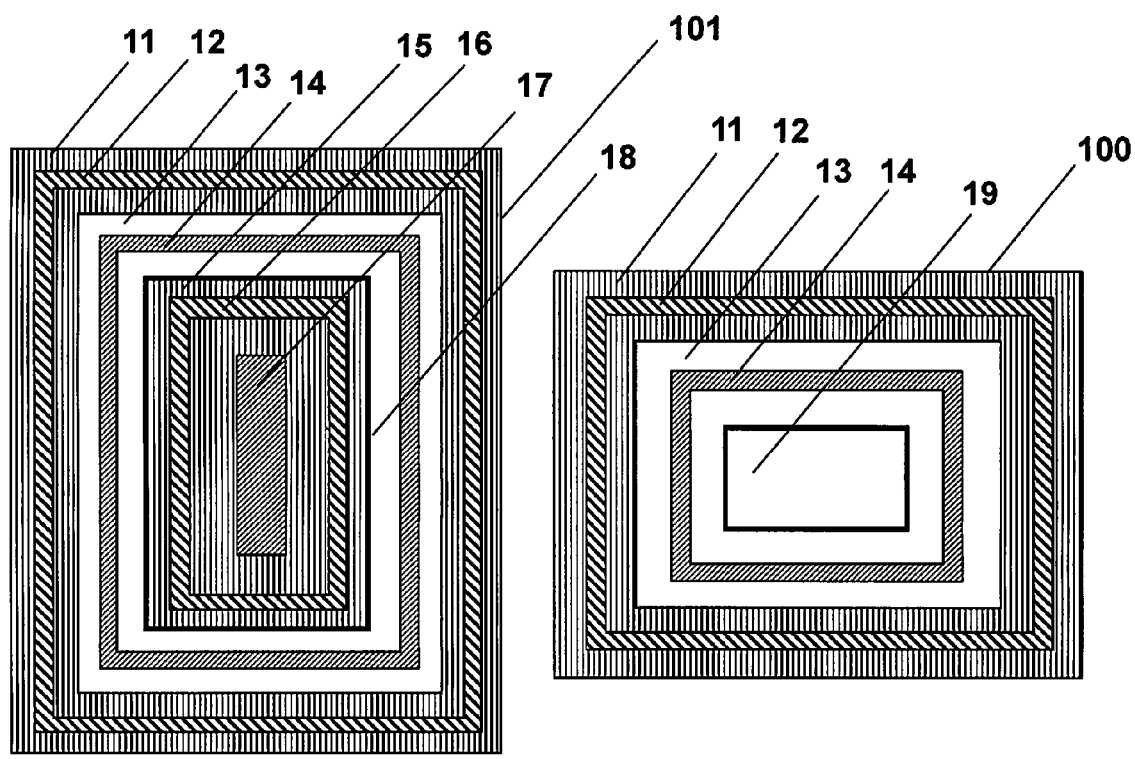
FIG. 6 is a plan view of a protection circuit according to the second conventional example.

Next, in the n-type well region 11, for example, an n-type high concentration region 12 is formed, containing phosphorus as an impurity and having a concentration of about $1\times10^{20}$ cm$^{-3}$, so as to surround the p-type high concentration region 17 and the p-type well region 13, as a contact of the n-type well region 11 to, for example, a power supply terminal. Then, a drain of the n-channel MOS type field effect transistor 19 having the gate in an off state and the p-type high concentration region 17 corresponding to the anode of the protection diode are connected to an I/O terminal, the p-type high concentration diffusion region 14 serving as the first conductivity type guard ring is connected to the ground terminal, and the n-type high concentration region 12 serving both as the contact of the second conductivity type guard ring and the cathode of the protection diode is connected to the power supply terminal. In this manner, a semiconductor device for electrostatic discharge protection having the same circuit configuration as the second conventional example (FIG. 5) is provided.

In this embodiment, a case where an n-channel MOS type field effect transistor 19 having a gate in an off state is used as the ESD protection element is described. However, other than the n-channel MOS type field effect transistor 19 having the gate in an off state, a protection diode or a thyristor may be used as the ESD protection element.

A distance between the p-type high concentration region 17 and the n-type high concentration region 12 which surrounds the p-type high concentration region 17 should be set to such a length that, in a case where the overcurrent noise of the latch-up test is applied to the I/O terminal, the overcurrent noise does not pass through the n-type high concentration region 12 and flow into the substrate. The reason for the overcurrent noise flows into the substrate is that recombination of minority carriers injected from the p-type high concentration region 17, corresponding to the anode, into the n-type well region 11 is prevented in the n-type well region 11, and the unrecombined minority carriers reach the p-type substrate. Accordingly the n-type well region 11 should be formed sufficiently wide. A distance 20 between edges of the p-type high concentration region 17 and the n-type high concentration region 12 in a lateral direction is set to, for example, about 10 μm.

Second Embodiment

Figure 2:
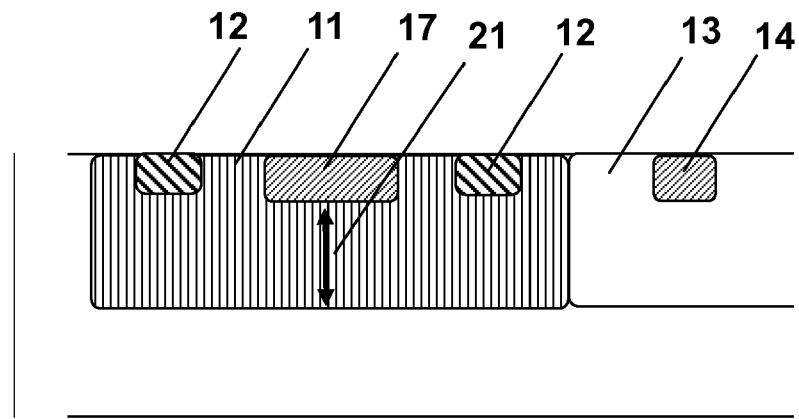
FIG. 2 is a cross sectional view of the semiconductor device for electrostatic discharge protection according to the first embodiment of the present invention.
Figure 3:
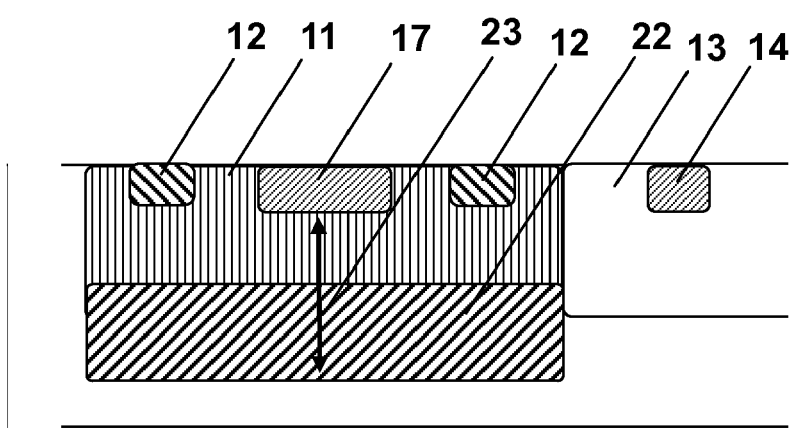
FIG. 3 is a cross sectional view of a semiconductor device for electrostatic discharge protection according to a second embodiment of the present invention.
Figure 4:
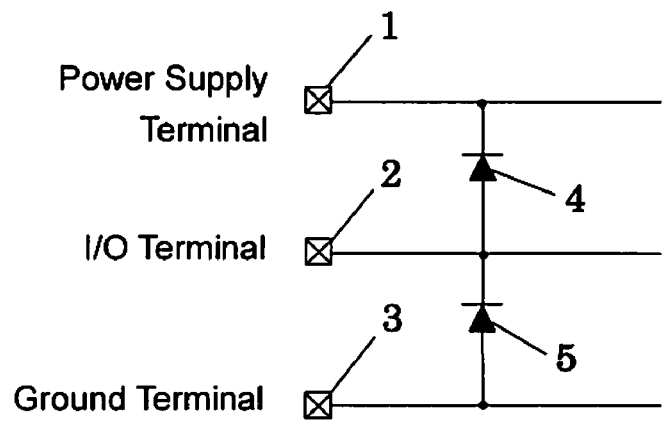
FIG. 4 is a protection circuit diagram according to a first conventional example.

FIG. 2 is a cross sectional view taken along the broken line AA of the semiconductor device for electrostatic discharge protection 102 according to the first embodiment of the present invention. In the case where the overcurrent noise of the latch-up test is applied to the I/O terminal, a current amount of the overcurrent noise allowed to pass through the n-type high concentration region 12 and then flow into a substrate terminal is often limited due to a distance 21 between the anode and the cathode of the diode for protection against the overcurrent noise of the latch-up test in a vertical direction. As a preferred embodiment in such a case, FIG. 3 illustrates a cross sectional view of a semiconductor device for electrostatic discharge protection 104 according to a second embodiment of the present invention. In this embodiment, under the n-type well region 11 of the first embodiment, for example, an n-type embedded region 22 is formed, containing phosphorus as an impurity and having a concentration of about $1\times10^{16}$ cm$^{-3}$. Since the carrier recombination in this portion increases in this structure, a current amount passing through the n-type high concentration region 12 and then flowing into the substrate is reduced, preventing a parasitic bipolar transistor formed between internal elements from turning on, and simultaneously permitting protection of an inner circuit from both the overcurrent noise of the ESD and the overcurrent noise of the latch-up test. Further, the protection element may be reduced in size. Note that, a distance 23 between the anode and the cathode in the vertical direction is preferred to be, for example, about 20 μm.

What is claimed is:

1. A semiconductor device for electrostatic discharge protection, comprising:
    a semiconductor substrate;
    an electrostatic discharge (ESD) protection element disposed in a surface of the semiconductor substrate and connected between an input/output terminal and a ground terminal;
    a first well region having the same conductivity type as the semiconductor substrate, and surrounding the ESD protection element;
    a first high concentration substrate region having the same conductivity type as the semiconductor substrate, and surrounding the ESD protection element in the first well region;
    a second well region having an opposite conductivity type to the conductivity type of the semiconductor substrate, and surrounding an outer side of the first well region;
    a high concentration anode region having the same conductivity type as the semiconductor substrate, disposed in the second well region separately from the first well region; and
    a second high concentration diffusion region having the opposite conductivity type to the conductivity type of the semiconductor substrate and disposed in the second well region, the second high concentration diffusion region surrounding the high concentration anode region disposed in the second well region and the first well region as a guard ring of the ESD protection element, the guard ring of the ESD protection element corresponding to a cathode of a latch-up protection diode, wherein:
    the high concentration anode region is connected to the input/output terminal;

the first high concentration substrate region is connected to the ground terminal; and the second high concentration diffusion region is connected to a power supply terminal.

2. A semiconductor device for electrostatic discharge protection according to claim 1, wherein the ESD protection element comprises a protection diode which has an anode connected to the input/output terminal and a cathode connected to the ground terminal.

3. A semiconductor device for electrostatic discharge protection according to claim 1, wherein the ESD protection element comprises a metal oxide semiconductor (MOS) transistor which has a drain connected to the input/output terminal and a source, a gate, and a backgate connected to the ground terminal.

4. A semiconductor device for electrostatic discharge protection, comprising:
 a semiconductor substrate;
 an electrostatic discharge (ESD) protection element disposed in a surface of the semiconductor substrate and connected between an input/output terminal and a ground terminal;
 a first well region having the same conductivity type as the semiconductor substrate, and surrounding the ESD protection element;
 a first high concentration substrate region having the same conductivity type as the semiconductor substrate, and surrounding the ESD protection element in the first well region;
 a second well region having an opposite conductivity type to the conductivity type of the semiconductor substrate, and surrounding an outer side of the first well region;
 a high concentration anode region having the same conductivity type as the semiconductor substrate, disposed in the second well region; and
 a second high concentration diffusion region having the opposite conductivity type to the conductivity type of the semiconductor substrate, disposed in the second well region to surround each of the high concentration anode region and the first well region and to share a part thereof, wherein:
 the high concentration anode region is connected to the input/output terminal;
 the first high concentration substrate region is connected to the ground terminal; and
 the second high concentration diffusion region is connected to a power supply terminal;
 wherein the ESD protection element comprises a thyristor which has an anode connected to the input/output terminal and a cathode connected to the ground terminal.

5. A semiconductor device for electrostatic discharge protection, comprising:
 a semiconductor substrate;
 an electrostatic discharge (ESD) protection element disposed in a surface of the semiconductor substrate and connected between an input/output terminal and a ground terminal;
 a first well region having the same conductivity type as the semiconductor substrate, and surrounding the ESD protection element;
 a first high concentration substrate region having the same conductivity type as the semiconductor substrate, and surrounding the ESD protection element in the first well region;
 a second well region having an opposite conductivity type to the conductivity type of the semiconductor substrate, and surrounding an outer side of the first well region;
 a high concentration anode region having the same conductivity type as the semiconductor substrate, disposed in the second well region; and
 a second high concentration diffusion region having the opposite conductivity type to the conductivity type of the semiconductor substrate, disposed in the second well region to surround each of the high concentration anode region and the first well region and to share a part thereof, wherein:
 the high concentration anode region is connected to the input/output terminal;
 the first high concentration substrate region is connected to the ground terminal;
 the second high concentration diffusion region is connected to a power supply terminal; and
 an embedded layer having the same conductivity type as the second well region, formed under the second well region so as to increase carrier recombination.

* * * * *